United States Patent
Mienkina et al.

(10) Patent No.: US 9,065,475 B2
(45) Date of Patent: Jun. 23, 2015

(54) SIN-COS SENSOR ARRANGEMENT, INTEGRATED CIRCUIT AND METHOD THEREFOR

(75) Inventors: Martin Mienkina, Bystrice nad Olsi (CZ); Leos Chalupa, Jemnice (CZ)

(73) Assignee: Freescale Semiconductor, Inc., Austin, TX (US)

( * ) Notice: Subject to any disclaimer, the term of this patent is extended or adjusted under 35 U.S.C. 154(b) by 1671 days.

(21) Appl. No.: 12/302,221

(22) PCT Filed: Jun. 1, 2006

(86) PCT No.: PCT/EP2006/062849
§ 371 (c)(1),
(2), (4) Date: Nov. 24, 2008

(87) PCT Pub. No.: WO2007/137625
PCT Pub. Date: Dec. 6, 2007

(65) Prior Publication Data
US 2009/0187372 A1 Jul. 23, 2009

(51) Int. Cl.
*G01C 17/00* (2006.01)
*H03M 1/64* (2006.01)

(52) U.S. Cl.
CPC ..................................... *H03M 1/645* (2013.01)

(58) Field of Classification Search
CPC ..... H03M 1/645; H04B 1/001; H04B 1/0092; H04B 1/28; H04L 27/2602
USPC ........................ 702/94, 96, 104, 151; 700/66; 324/76.77; 318/560, 661
See application file for complete search history.

(56) References Cited

U.S. PATENT DOCUMENTS

| | | | |
|---|---|---|---|
| 4,831,510 A | 5/1989 | Dummermuth et al. | |
| 5,079,549 A | 1/1992 | Liessner | |
| 5,162,798 A | 11/1992 | Yundt | |
| 5,612,906 A | 3/1997 | Gotz | |
| 5,637,998 A | 6/1997 | Kushihara | |
| 5,815,424 A | 9/1998 | Kushihara | |
| 5,949,359 A | 9/1999 | Vlahu | |
| 6,342,880 B2 * | 1/2002 | Rosenberg et al. | 345/161 |

(Continued)

FOREIGN PATENT DOCUMENTS

JP 05209710 A 8/1993

OTHER PUBLICATIONS

Hagiwara et al: "A Method of Improving the Resolution and Accuracy of Rotary Encoders Using Code Compensation Technique"; Instrumentation and Measurement Technology Conference, USA, May 1991.

*Primary Examiner* — Elias Desta

(57) ABSTRACT

A Sin-Cos sensor arrangement comprises a Sin-Cos sensor operably coupled to signal processing logic via a hardware interface. The hardware interface is arranged to provide the signal processing logic with analog sine and cosine waveforms indicative of fine position data and binary counterparts of the analog sine and cosine waveforms (Phase_A and Phase_B) indicative of rough position data. The signal processing logic is arranged to determine a position and speed of the Sin-Cos sensor by compensating for inaccuracies between analog sine and cosine waveforms and their binary counterparts. In this manner, a fully software-based solution provides a fast, efficient and high accuracy position and speed estimation based on the processing of the analog sine and cosine signals and the digital representation thereof of the Sin-Cos sensor.

21 Claims, 5 Drawing Sheets

(56) References Cited

U.S. PATENT DOCUMENTS

| | | |
|---|---|---|
| RE37,547 E | 2/2002 | Anagnost |
| 6,754,610 B2 | 6/2004 | Dudler et al. |
| 6,894,629 B2 | 5/2005 | Takehara |
| 7,294,988 B2 * | 11/2007 | Ajima et al. ............ 318/712 |
| 2002/0173931 A1 | 11/2002 | Dudler et al. |
| 2004/0210416 A1 | 10/2004 | Rodi |
| 2005/0132802 A1 | 6/2005 | Kobayashi |

* cited by examiner

FIG. 1 - Prior art
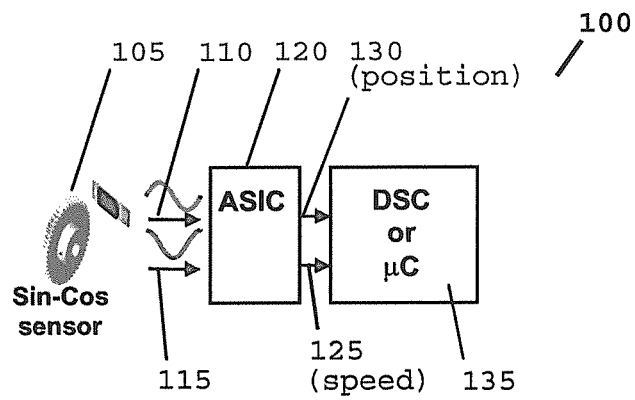
FIG. 2
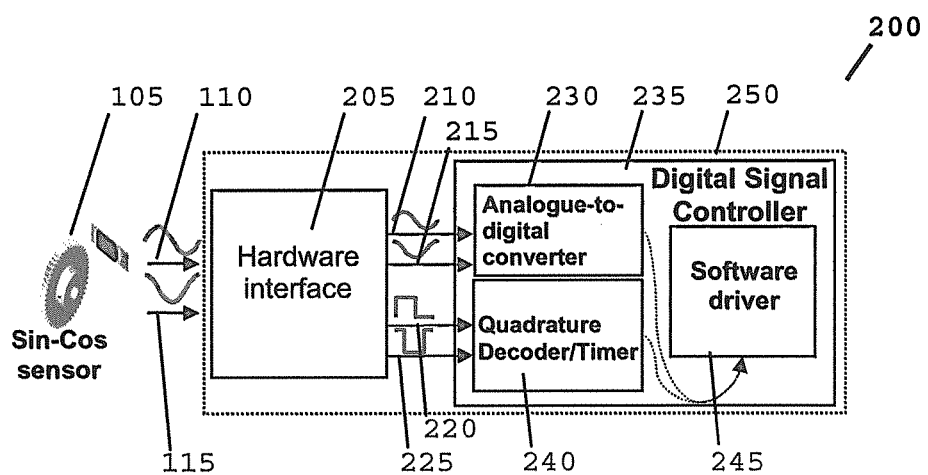

SIN-COS SENSOR ARRANGEMENT, INTEGRATED CIRCUIT AND METHOD THEREFOR

FIELD OF THE INVENTION

The present invention relates to a Sin-Cos sensor arrangement. The invention is applicable to, but not limited to, a software algorithm (driver) that enables a more accurate measurement of a position and speed of Sin-Cos (resolver) sensors.

BACKGROUND OF THE INVENTION

With the increasing demand for electronic devices to have reduced current consumption, and to further avoid excessive use of off-chip components, there has been an increasing trend for electronic devices to perform an increased amount of processing in the digital domain. Electronic devices for generating digital signals, representative of amplitude modulated and encoded analogue signals, are well known. Consequently, there has been an increasing demand for high-resolution, low-power, and inexpensive analogue-to-digital converter.

One group of such electronic devices includes rotary transducers that provide instantaneous information regarding angular position about an axis, and means for rendering that information in digital form. Such transducers include resolvers, i.e. electromagnetically-operated sensing analogue devices, which are typically combined with further electronic components to provide a digital output representative of a measured mechanical angular position.

Product packaging plants and stamping press lines are ideal examples of where you might find resolver based systems in operation. In typical applications, the resolver sensor feeds rotary position data to a decoder stationed in a Programmable Logic Controller (PLC) that interprets this information and executes commands based on the machine's position. Thus, resolvers are widely used and particularly their role in the world of automation is unparalleled.

A resolver typically comprises a rotor that generally has an input or excitation winding and a stator having a pair of output windings. The excitation winding is driven by a sine wave reference. As the rotor turns, the coupling relationship from the rotor to the stator changes correspondingly with shaft angle. In particular, the amplitudes of the voltages of the stator windings ideally respectively vary as the sine and the cosine of the shaft angle.

The detailed output voltage of each output winding can be expressed mathematically by a first term that is in-phase with the carrier excitation and independent of the angular velocity, and a second term that is exactly in-quadrature with the carrier excitation and depends linearly on the velocity of the rotor. Therefore, synchronous demodulation of the sensor (resolver) output will yield signals representative of the sine and cosine of the shaft angle, independently of velocity. As the sine and cosine components of an angle uniquely define that angle, then the resolver output can be decoded to measure the resolver mechanical angle, independently of resolver velocity.

The majority of resolvers generate one or several sine and cosine cycles per rotor turn—the number of cycles reflects the number of pole pairs of the resolver. A maximum of 3-pole pairs resolvers are typically used in industrial, appliance and automotive applications yielding maximum of three sine and cosine cycles per rotor turn—the more cycles per rotor turn the better accuracy of the final angular position and speed measurement.

Nowadays developers of modern systems often require more added value and accuracy, in less space, in order to address specific needs of their designs. Due to this fact, recently introduced Sin-Cos sensors based on the magneto-resistance, optical and inductive principles are more advanced and capable of generating higher numbers of sine and cosine cycles per rotor turn. This yields higher accuracy of the angular position and speed measurement.

Often, these modern Sin-Cos sensors are sold as application specific integrated circuits, as shown in the arrangement 100 of FIG. 1. Here, a Sin-Cos sensor 105 outputs both a sine waveform 110 and a cosine waveform 115 directly to the dedicated processing circuit (ASIC) 120. The processing ASIC 120 then interprets this data to provide outputs relating to speed 125 and position 130 of the rotor windings to a digital signal controller (DSC) or microcontroller 135.

However, in a number of applications, this requirement to additionally integrate a dedicated Sin-Cos sensor processing ASIC 120 on the printed circuit board, solely to deal with accurately determining Sin-Cos output signals, significantly increases design costs, which naturally provide an opportunity for novel and low-cost Sin-Cos sensor signal processing solutions.

General angle tracking observer algorithms are known. Such algorithms are only used in cases having up to several sine and cosine cycles per rotor turn. Furthermore, processing of high numbers of sine and cosine cycles, per rotor revolution, inherently require a shortened period for an angle observer calculation. This significantly increases the processing load in extracting data relating to the position, speed and number of revolutions of the rotor windings, from signals extracted from the Sin-Cos sensor.

Thus, in summary, known hardware solutions for extracting information from Sin-Cos sensors are predominantly ASIC-based. Hence, these solutions are generally expensive and fail to provide customers with an adequate level of flexibility and/or estimation accuracy. In contrast, existing software solutions fail to provide accurate estimations and/or require huge computational power to perform accurate estimation.

The existing software solutions are based on reading and processing tenths of sine and cosine samples per one cycle (rotor turn). Utilizing existing software solutions for processing modern and highly integrated Sin-Cos sensors, distinguished by high number of sine and cosine cycles generated per rotor turn, naturally brings increasing demand for processing power. The processing power demand grows linearly with a number of sine and cosine cycles per rotor turn. Modern Sin-Cos sensors generate from 32 up to 1024 sine and cosine cycles per rotor turn, thus, effectively eliminating usage of standard software methods (drivers) for processing their sine and cosine signals.

US20050132802 A1, describes an angle computation method and apparatus for variable reluctance resolver, MINEBEA CO., LTD. US20040210416 A1, describes a measuring system for processing angular and linear measured values. U.S. Pat. No. 6,754,610 B2, describes digital signal processing of resolver rotor angle signals.

The above solutions are based on processing sensor analog sine and cosine signals. Therefore, their processing demand rises linearly with increasing number of sine and cosine cycles per rotor turn, which results in their teaching being less applicable for present day needs.

Thus, a need exists for an improved mechanism to process Sin-Cos data from a Sin-Cos sensor and method of operation therefor.

SUMMARY OF THE INVENTION

In accordance with aspects of the present invention, there is provided a Sin-Cos sensor arrangement, integrated circuit and method of operation therefor, as defined in the appended Claims.

BRIEF DESCRIPTION OF THE DRAWINGS

FIG. 1 illustrates a known Sin-Cos data processing mechanism.

Figure 3:
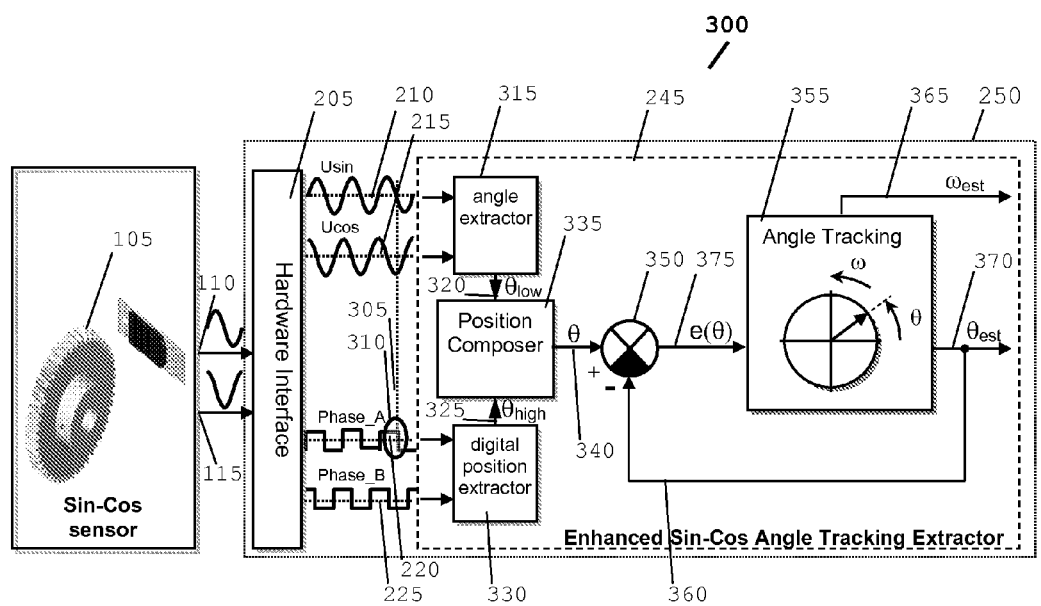
Figure 4:
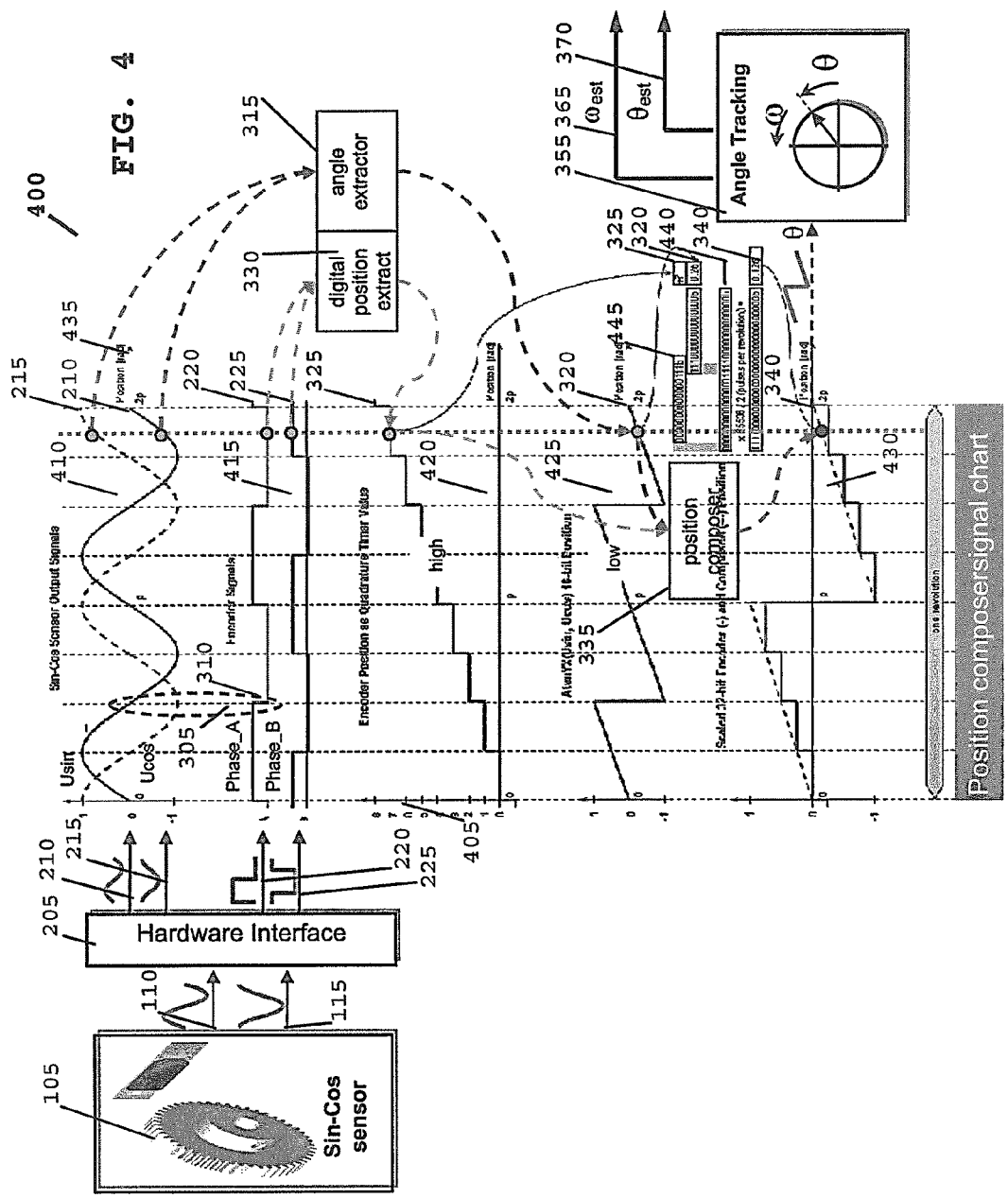
Figure 5:
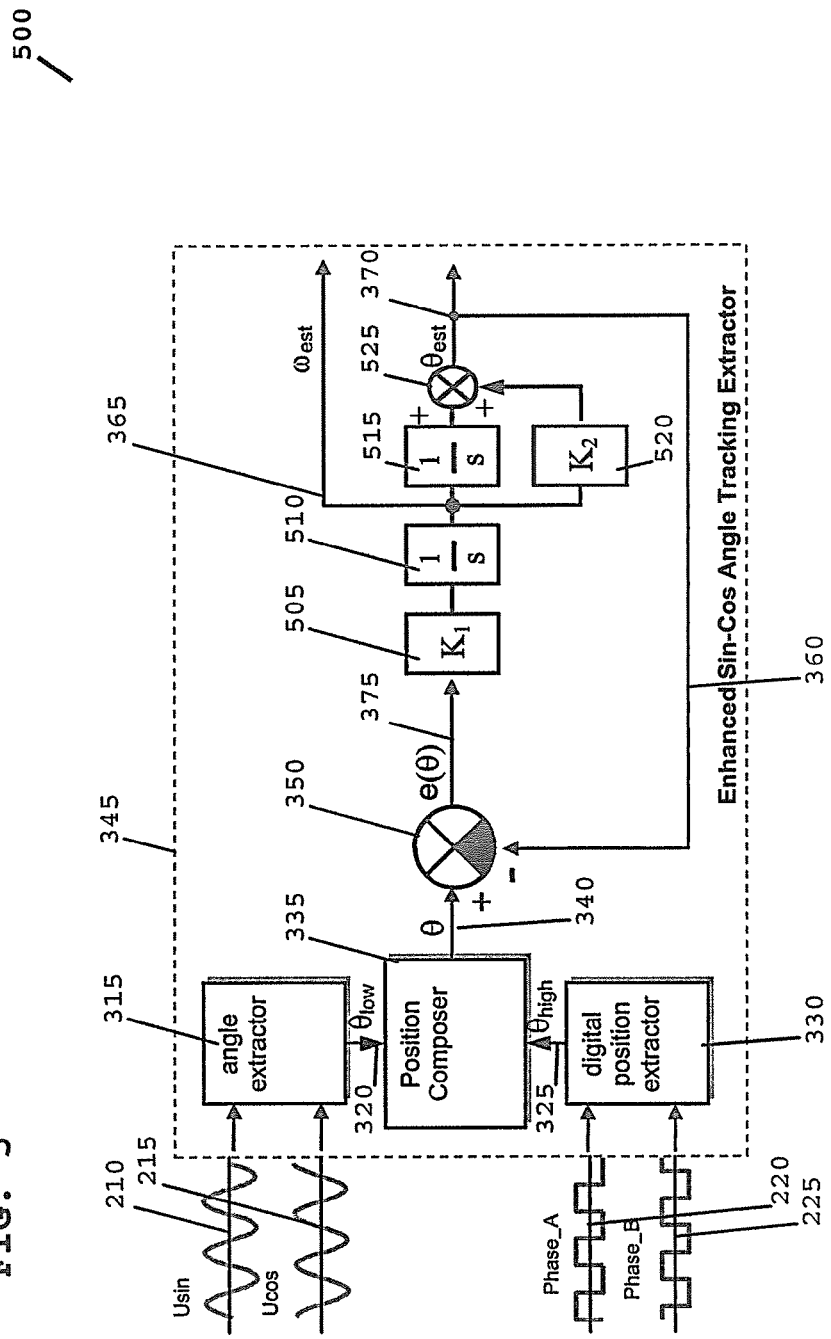
Figure 6:
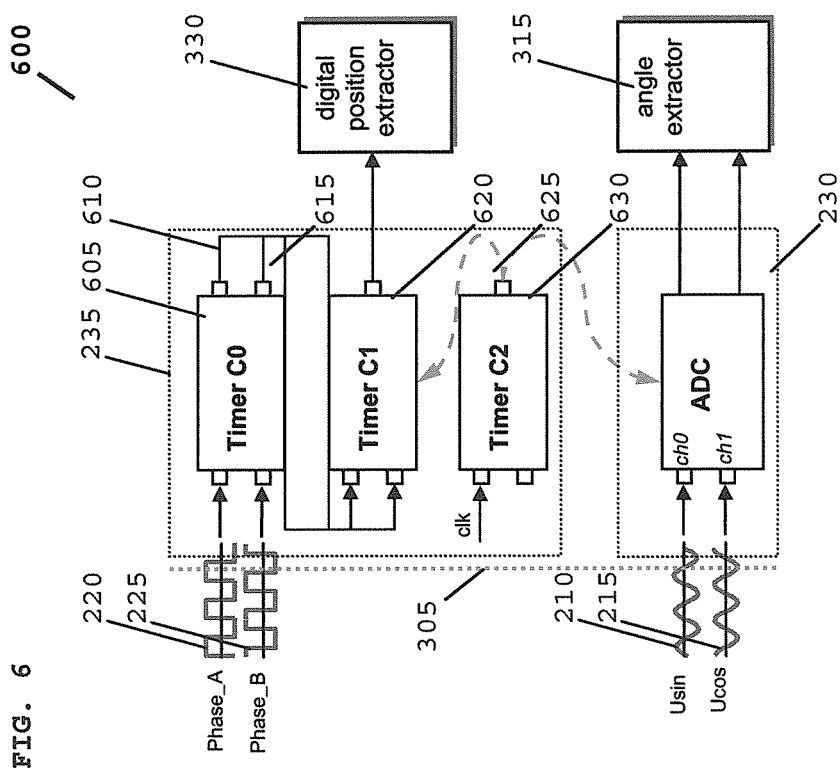

Exemplary embodiments of the present invention will now be described, by way of example only, with reference to the accompanying drawings, in which:

FIG. 2 illustrates a combined hardware and software arrangement in accordance with embodiments of the present invention;

FIG. 3 illustrates a Sin-Cos sensor signal processing logic arrangement in accordance with embodiments of the present invention;

FIG. 4 illustrates a series of the Sin-Cos and pre-processed waveforms in accordance with embodiments of the present invention;

FIG. 5 illustrates a block diagram of the angle tracking observer logic in performing a transfer function to determine the smooth position and speed estimates of the Sin-Cos sensor in accordance with embodiments of the present invention; and FIG. 6 illustrates an advanced implementation of the synchronization mechanism in accordance with embodiments of the present invention.

DESCRIPTION OF EMBODIMENTS OF THE INVENTION

In one embodiment of the present invention, a Sin-Cos sensor arrangement comprises a Sin-Cos sensor that is operably coupled to signal processing logic via a hardware interface. In the context of the present invention, it is envisaged that the term 'Sin-Cos sensor' may be used for measurement of various quantities. In particular, it is envisaged that the term 'Sin-Cos sensor' may be considered as any type of sensor, such as angular position sensor, horizontal/vertical movement sensor, speed sensor, acceleration sensor, etc., which may be characterized by generating either sine and cosine output waveforms or phase shifted sine and cosine waveforms or non-sinusoidal waveforms or any relationship (such as a tangent) therebetween.

The hardware interface is arranged to provide the signal processing logic with analogue sine and cosine waveforms indicative of fine position data and binary counterparts of the analogue sine and cosine waveforms (phase_A and phase_B) indicative of rough position data. The signal processing logic is arranged to determine a position and speed of the Sin-Cos sensor by compensating for inaccuracies between analogue sine and cosine waveforms and their binary counterparts.

In this manner, by compensating for inaccuracies between analogue sine and cosine waveforms and their binary counterparts a low-cost, efficient mechanism is described to implement a high precision Sin-Cos sensor interface. Due to the low processor requirement in performing the compensation calculations, the Sin-Cos sensor arrangement may lend itself to high volume applications. The Sin-Cos sensor arrangement may use low-cost external hardware, for example Schmitt triggers may be used instead of expensive comparators.

In one embodiment of the present invention, the signal processing logic may comprise a software driver to perform compensation for inaccuracies between analogue sine and cosine waveforms and their binary counterparts. The software driver may provide a cost benefit for users/customers due to the need for smaller memory and lower calculation power. In addition, the software driver may be able to check a number of overflows of estimated position ($\theta_{est}$), and thus accurately monitor a number of rotor revolutions.

In one embodiment of the present invention, the signal processing logic may comprise angle extractor logic arranged to provide fine position data based on one or more of the following: analysis performed on the analogue sine and cosine waveforms, analysis of the analogue sine and cosine waveforms or any non-linear waveforms, for example where the non-linear waveforms are approximated either by a set of differential functions and/or using a look-up table.

In one embodiment of the present invention, the analogue sine and cosine waveforms may be generated by either the hardware interface or directly by the Sin-Cos sensor.

In one embodiment of the present invention, the signal processing logic may comprise digital position extractor logic arranged to provide rough position data based on phase counting of the binary counterpart signals.

The angle extractor logic may be designed not only to perform calculation of four quadrant inverse tangent function, which is used in most applications where Sin-Cos sensors generate pure sine and cosine waveforms, but it may materialize angle extraction from either non-sinusoidal signals or signals of various phase-shifts. This fact, together with the possibility to compensate for phase shifts between analogue sine and cosine signals and their binary counterparts, makes the software driver ideal for processing signals of generic Sin-Cos sensors equipped with low-cost hardware interfaces.

In one embodiment of the present invention, the angle extractor logic and the digital position extractor logic may be operably coupled to position composer logic arranged to combine the fine position data with rough position data.

In one embodiment of the present invention, the position composer logic may be operably coupled to angle tracking observer logic arranged to provide speed estimates ($\omega_{est}$). The angle tracking observer logic may apply a transfer function to smooth and precisely scale the composed position of the form:

$$F(s) = \frac{\hat{\Theta}(s)}{\Theta(s)} = \frac{K_1(1 + K_2 s)}{s^2 + K_1 K_2 s + K_1}$$

The angle tracking observer logic may yield not only position estimates ($\theta_{est}$), but also speed estimates ($\omega_{est}$) as an outer product of calculations. The interconnection of the 'position composer' and 'angle tracking observer' logic may be applied as a fully software-based solution that provides a fast, efficient and high accuracy position and speed estimation based on the processing of the sine and cosine signals of the Sin-Cos sensors. The dynamic response and noise reduction of estimated position ($\theta_{est}$) and estimated speed ($\omega_{est}$) may be fully controlled by parameters $K_1$ and $K_2$ of the angle tracking observer.

In one embodiment of the present invention an integrated circuit for operable coupling to a Sin-Cos sensor is described. The integrated circuit comprises signal processing logic operably coupled to a hardware interface. The hardware interface is arranged to provide the signal processing logic with analogue sine and cosine waveforms indicative of fine position data and binary counterparts of the analogue sine and cosine waveforms (phase_A and phase_B) indicative of rough position data. The signal processing logic is arranged to determine a position and speed of the Sin-Cos sensor by compensating for inaccuracies between analogue sine and cosine waveforms and their binary counterparts.

In one embodiment of the present invention, a method for determining a position and speed of a Sin-Cos sensor is described. The method comprises sampling analogue sine and analogue cosine signals indicative of fine position data ($\theta_{low}$); performing phase decoding of the sampled analogue sine and analogue cosine signals to generate binary counterpart signals indicative of rough position data ($\theta_{high}$); and combining the rough position data ($\theta_{high}$) with the fine position data ($\theta_{low}$) to compensate for inaccuracies between analogue and cosine waveforms and their binary counterparts.

One embodiment of the present invention will be described in terms of digital signal controller (DSC) or microcontroller architecture. However, it will be appreciated by a skilled artisan that the inventive concept herein described may be embodied in any type of system or application capable of using Sin-Cos/resolver sensors. For example, some of the envisaged applications include 'x-by-wire' techniques in an automotive scenario (e.g. throttle-steer-brake) as well as servo-motor applications.

Referring now to FIG. 2, a Sin-Cos data calculation arrangement 200 is shown illustrating embodiments of the present invention. The Sin-Cos data calculation arrangement 200 comprises a Sin-Cos sensor 105 arranged to output both a sine waveform 110 and a cosine 115 waveform to Sin-Cos sensor signal processing logic 250 comprising a hardware interface 205. The hardware interface 205 passes the interpreted analogue and binary data to a software driver 245, which is operably coupled to a digital signal controller or microcontroller 235 for calculating speed and position of the rotor shaft of the motor (not shown) that the Sin-Cos sensor is operable coupled to.

In one embodiment of the present invention, the software driver 245 is arranged to run on the digital signal controller or microcontroller 235. In one embodiment of the present invention, the software driver 245 uses both sine 210 and cosine 215 samples measured by an analogue-to-digital converter 230 and a rough position value provided by quadrature decoder/timer block 240. In one embodiment of the present invention, the rough position value may be obtained from measured or estimated phases, e.g. phase_A 220 and phase_B 225, of the binary signals.

In one embodiment of the present invention, the quadrature decoder/timer block 240 may, in fact, be an on-chip peripheral module of the digital signal controller or microcontroller 235, which is arranged to process 90 degree shifted phase_A 220 and phase_B 225 binary signals into a form of position increment or decrement values (as shown with position increment or decrement values 325 in FIG. 3). Thus, the phase_A 220 and phase_B 225 binary signals may be used by the software driver 245 to increase a resolution and an accuracy of the position ($\theta_{est}$ 370 in FIG. 3) and speed ($\omega_{est}$ 365 in FIG. 3) estimates and to lower a calculation period of the enhanced Sin-Cos angle tracking calculation logic (345 of FIG. 3).

In one embodiment of the present invention, the Sin-Cos sensor 105 generates a high number of sine and cosine pulses per one-rotor revolution. The more sine and cosine pulses, the better accuracy of the position ($\theta_{est}$ 370) and speed ($\omega_{est}$ 365) estimates.

Referring now to FIG. 3, the Sin-Cos sensor signal processing logic 250 of FIG. 2 is illustrated in greater detail. The signal processing logic 250 comprises a hardware interface 205 operable coupled to the Sin-Cos sensor 105 providing both the sine 210 and cosine 215 waveforms. In addition, the hardware interface 205 generates two respective binary signals, one identified as phase_A 220 and one identified as phase_B 225. These binary signals are outputs of comparators or Schmitt triggers integrated on the hardware interface 205 and supplied directly by sine 110 and cosine 115 waveforms of the Sin-Cos sensor 105.

The sine 210 and cosine 215 signals output from the hardware interface 205 are input to angle extractor logic 315, which determines and extracts a fine position ($\theta_{low}$) 320. The angle extractor logic 315 forwards the fine position ($\theta_{low}$) 320 to position composer logic 335. In addition, the two respective binary signals, phase_A 220 and phase_B 225, are input to a digital position extractor logic 330, which determines and extracts a rough position ($\theta_{high}$) 325. The digital position extractor logic 330 also forwards the rough position ($\theta_{high}$) 325 to the position composer logic 335.

The position composer logic 335 outputs a 32-bit scaled composed position ($\theta$ 340) to a summation block 350, which outputs an error signal e($\theta$) to angle tracking observer logic 355. In this manner, the position composer logic 335 scales the composed position ($\theta$ 340). The angle tracking observer logic 355 smoothes the composed position ($\theta$ 340) and outputs both the estimated speed ($\omega_{est}$) 365 and estimated position ($\theta_{est}$ 370). Thus, in combination, the position composer logic 335 and angle tracking observer logic 355 together output a smooth, more accurate position value. The estimated position ($\theta_{est}$) 370 is also fed back 360 to a negative input of the summation block 350 to form a closed loop observer system.

Furthermore, the software driver 245 is arranged to provide an angle tracking observer calculation, thereby introducing 'smoothing' and 'averaging' into the system. The angle tracking observer logic 355 transforms the 32-bit scaled composed position ($\theta$) 340 into its smoothed form, named estimated position ($\theta_{est}$) 370. In one embodiment of the present invention, the angle tracking observer logic 355 may also generate the estimated speed ($\omega_{est}$) 365 as an outer product of the position calculation ($\theta_{est}$) 370. The software driver 245 is arranged to output also number of revolutions. This quantity is not given directly by the angle tracking observer logic 355, but it is rather calculated inside the driver by incrementing/decrementing counter value at each overflow of the estimated position ($\theta_{est}$ 370).

In a number of the above embodiments, the processing of the Sin-Cos sensor signals only requires a small hardware conditioning interface. Most of the signal processing occurs in the digital signal controller or the microcontroller, as the software driver is arranged such that it requires negligible computational power and minimal peripheral resources to obtain accurate position, speed and revolution estimates. Consequently, the Sin-Cos signal processing is able to run as a background task while the digital signal controller or the microcontroller performs its normal functions, for example executing customer specific tasks (driving the motor, communicating with other systems, etc.) in the foreground.

In this manner, by provision of the signal processing in the digital signal controller or the microcontroller, with a supporting software driver 245, it is possible to achieve significant cost reductions and improved reliability and accuracy of the Sin-Cos data calculation.

In embodiments of the present invention, the Sin-Cos angle tracking observer logic 355 can be used to acquire position and speed estimates from analogue sine 210 and cosine 215 signals taken from any type of Sin-Cos or resolver sensors.

In embodiments of the present invention, the position-composer logic 335 provides particular advantages when the Sin-Cos sensor 105 generates more than a single sine and cosine cycle per mechanical revolution of the Sin-Cos sensor 105. In such a scenario, the position composer logic 335, in connection with angle tracking observer logic 355, provides accurate estimated position and speed of the Sin-Cos sensor 105 that is proportionally increased by the number of sine and cosine cycles per rotor revolution.

Thus, in this manner, the software driver 245 is able to compensate phase inaccuracies 310 sporadically and/or periodically that occur between analogue sine 210/cosine 215 waveforms and the digital phase_A 220/phase_B 225 binary signals. This advantageously allows usage of low-cost 'Schmitt triggers' for the generation of the phase_A 220 and phase_B 225 binary signals, instead of expensive comparators. Furthermore, if the digital signal controller or microcontroller has 'Schmitt-triggered' general purpose input-output (GPIO) ports, then external comparators/Schmitt triggers, otherwise indispensable to be populated externally on the hardware interface 205, may be completely removed. The software driver 245 calculation steps are illustrated in FIG. 4.

FIG. 4 illustrates a method of calculating the 32-bit scaled composed position 340, and further propagation of this quantity to the angle tracking observer logic 355 of FIG. 3. FIG. 4 illustrates an example with constant rotor speed, with the Sin-Cos sensor 105 generating two periods of sine 210 and cosine 215 signal per revolution, with zero hysteresis 310. On the horizontal axis there is displayed rotor angular position in radians 435. FIG. 4 depicts all signals throughout one revolution 410, 420, 415, 420, 425 and 430.

The method 400 to obtain the 32-bit scaled composed position (θ) 340 comprises the following steps:
(i) sampling sine 210 and cosine 215 signals of the hardware interface 205, by the analogue-to-digital converter 230, as depicted in the first graph 410.
(ii) Calculating a fine position value ($\theta_{low}$) 320 using angle extractor logic 315 (for example a four quadrant inverse tangent) from the sine 210 and cosine 215 samples to obtain an AtanYX position 320 (denoted as $\theta_{low}$) in the fourth graph 425.
(iii) Decoding output signals phase_A 220 and phase_B 225 of the hardware interface 205, using digital position extractor 330 (quadrature decoder/timer block 235) of FIG. 3, to obtain a rough position value 325 (denoted as $\theta_{high}$) in the third graph 420.
(iv) Combining the rough position value 325 (denoted as $\theta_{high}$) with the fine position value 320 (denoted as $\theta_{low}$) using position composer logic 335 to obtain the 32-bit composed position 440. The rough position 325 (provided by digital position extractor logic 330) is then put in higher bits 445 and is added with the fine position (provided by angle extractor logic 315), which is left unchanged 320.
(v) Scaling the 32-bit composed position 440 to a full 32-bit fractional range [−1, 1] in order to obtain the 32-bit scaled composed position 340 (displayed by the dashed line in the fifth graph 430).

In one embodiment of the present invention, the software driver 245 may perform alignment of the rough position of the digital position extractor logic 330 with fine position of the angle extractor logic 315. In FIG. 4 (see binary numbers 445 and 320) the lowest two bits of the left shifted rough position 445 (provided by digital position extractor logic 330) correspond with the highest two bits of the fine position 320 (given by angle extractor logic 315). This equality is referred to as an alignment of the rough position of the digital position extractor with fine position of the angle extractor.

The software driver 245 performs such alignment at each position computation step by adding a pulse error (_pulseError) to the non-aligned rough position of the digital position extractor (_pulses) using, for example, code fragment:
_temp32=_pulses+_pulseError; /* _temp32−aligned rough position*/

The pulse error (_pulseError) is calculated, during an initialization state of the software driver 245, as a difference of the highest two bits of the fine position 320 (AtanYX_position) and the lowest two bits of the non-aligned rough position 325 (_pulses) using, for example, code fragment:
_pulseError=(AtanYX_position>>14)−(_pulses&0x3);

In one embodiment of the present invention, the alignment of positions 320 and 325 is a prerequisite for the software driver operation and for phase shift correction, which advantageously allows usage of low-cost 'Schmitt triggers' instead of expensive comparators for phase_A 220 and phase_B 225 binary signal generation.

In FIG. 4 the phase_A 220 and phase_B 225 binary signals are acquired from Sin-Cos sensor 105 sine 110 and cosine 115 signals by feeding them through the hardware interface 205, which contains comparators and/or Schmitt triggers. These circuits are known to have a certain hysteresis, which respectively causes a tangible phase shift between the sine 210 and cosine 215 analogue signals and their phase_A 220, phase_B 225 binary counterparts.

The phase shift 310, which in FIG. 4 equals zero, is also corrected by software driver 245 at each calculation step. The correction is based on the comparison of the lowest two bits of the aligned rough position 325 (_temp32 and 0x3) and the highest two bits of the fine position 320 (AtanYX_position). If these two masked bits differ, which means that the rough and fine positions are not aligned properly due to hysteresis, the new aligned rough position (newPulses) has to be either incremented or decremented by '1', depending on the result of the comparison as shown, for example, in the fragment of code below:

```
if (AtanYX_position == ((_temp32)         &0x3))
{
    newPulses = _temp32;
}
else
if (AtanYX_position == ((_temp32+1L)&0x3))
{
    newPulses = _temp32+1L;
    pulseError++;
}
else
if (AtanYX_position == ((_temp32−1L)&0x3))
{
    newPulses = _temp32−1L; _
    pulseError−−;
}
```

This ensures re-alignment of the rough position 325 (given by the digital position extractor logic 330) with the fine position 320 (given by the angle extractor logic 315).

It is envisaged in other embodiments of the present invention, that the number of the Sin-Cos sensor 105 sine 110 and cosine 115 signal periods per revolution may not be limited to a power of '2'. Therefore also the increment/decrement of the rough position 325 corresponding to one revolution may also not be limited to a strict power of '2' implementation.

In order to prevent rough position discontinuity, for example when an overflow occurs, the resulting rough position (_pulses) may be updated at each step by the difference of the current rough position (pulses) and the previous rough position (_prevPulses), both given by quadrature decoder/timer block 235, as follows:

| _pulses | = _pulses + (pulses − _prevPulses); |
|---|---|
| _prevPulses | = pulses; |

With regard to the scaling of 32-bit composed position 440 to full 32-bit fractional range, the 32-bit composed position 440 may be scaled to a full 32-bit range according to the following relationship, for example:
32-bit scaled composed position (340)=32-bit composed position (440)*scaling_coefficient
where,
  scaling_coefficient=65535/nPulses; and
  'nPulses' is the number of the Sin-Cos sensor 105 output sine 110 and cosine 115 signal periods per one rotor revolution.

Thus, obtained 32-bit scaled composed position (θ 340) may then be fed to the angle tracking observer logic 355, which transforms the 32-bit scaled composed position (θ 340) into its smoothed form ($\theta_{est}$ 370). In addition, as previously mentioned, the angle tracking observer logic 355 may also generate estimated speed ($\omega_{est}$ 365) as an outer product of the position calculation and smoothing.

Referring now to FIG. 5, a further clarification of the Sin-Cos angle tracking observer logic 355 of FIG. 3, is illustrated. In effect, the Sin-Cos angle tracking observer logic 355 applies a transfer function to the error signal e(θ) 375 output from the summation block 350 to provide an estimated speed ($\omega_{est}$ 365) and estimated position ($\theta_{est}$ 370) of the Sin-Cos sensor 105. The estimated position ($\theta_{est}$ 370) is also fed back 360 to a negative input of the summation block 350 in order to form a closed loop observer system.

The Transfer function effectively comprises applying a K1 function 505 and 1/S function 510 to provide an estimated speed ($\omega_{est}$ 365) of the rotor. This is applied to a further 1/S function 515 and parallel K2 function 520, which are then coupled in the summation block 525 to provide an estimated position ($\theta_{est}$ 370) of the rotor. The parallel loop with K2 function 520 forms a predictive forward loop, which improves position estimates in dynamic modes of observer operation.

Thus, the transfer function applies the following:

$$F(s) = \frac{\hat{\Theta}(s)}{\Theta(s)} = \frac{K_1(1+K_2s)}{s^2 + K_1K_2s + K_1} \quad [1]$$

The angle tracking observer transfer function is a second order and has one zero. This real-axis zero affects the residue, or amplitude, of a response component but does not affect the nature of the response, for example an exponential damped sine waveform. It can be proven that the closer the zero is to the dominant poles, the greater its effect is on the transient response. As the zero moves away from the dominant poles the transient response approaches that of the two-pole system.

The characteristic polynomial of the transfer function corresponds to the denominator of transfer function [1]:

$$s^2 + K_1K_2s + K_1 \quad [2]$$

Appropriate dynamic behavior of the angle tracking observer transfer function 355 may be achieved by placement of the poles of the characteristic polynomial [2]. This general method is based on matching the coefficients of the characteristic polynomial with the coefficients of the general second-order system G(s):

$$G(s) = \frac{\omega_n^2}{s^2 + 2\zeta\omega_n + \omega_n^2} \quad [3]$$

where:
  $\omega_n$ is the Natural Frequency; and
  $\zeta$ is the Damping Factor.

Once the desired response of the general second-order system is found, the angle tracking observer coefficients $K_1$, $K_2$ can be calculated using expressions:

$$K_1 = \omega_n^2 \quad [4]$$
$$K_2 = \frac{2\zeta}{\omega_n}$$

Advantageously, in this manner, the software driver is able to adjust the output response by providing a way to the user to access and modify coefficients $K_1$ and $K_2$ of the angle tracking observer while running system.

Furthermore, the aforementioned transfer function [1] applies a natural smoothing feature to the position and speed estimation.

The noise reduction of the estimated position ($\theta_{est}$ 370) can be fully controlled by proper selection of the coefficients $K_1$ and $K_2$ of the angle tracking observer. The position estimation forward path (θ 340)→($\theta_{est}$ 370) is formed of two integrator elements 510 and 515. This double-integrator topology advantageously causes substantial natural attenuation of the noise.

It is clear that the level of noise in the speed estimation ($\omega_{est}$ 365) is more noticeable than in its position counterpart ($\theta_{est}$ 370). This is due to the fact that speed is propagated only through one integrator element 510 of the angle tracking observer forward path.

In one embodiment of the present invention, the Sin-Cos arrangement and method of operation support the aforementioned angle tracking calculation and may utilize synchronized analogue-to-digital converter 230 and quadrature decoder/timer block 235.

The fine position value ($\theta_{low}$) 320 is provided by angle extractor logic 315, based on the sine 210 and cosine 215 samples. The four quadrant inverse tangent function calculation may be used in case of pure sine 210 and cosine 215 samples. If the Sin-Cos sensor generates either phase shifted sine or non-sinusoidal waveforms, the fine position value ($\theta_{low}$) 320 may be obtained either by a set of differential functions correlating sensor outputs and/or by any look-up table techniques, as would be appreciated by a skilled artisan. The rough position value 325 ($\theta_{high}$) is provided by digital position extractor 330 (quadrature decoder/timer block 235) from signals phase_A 220 and phase_B 225 of the hardware interface 205.

In one embodiment of the present invention, the sine 210 and cosine 215 analogue quantities are measured by analogue-to-digital converter 230 concurrently with decoding operation of the phase_A 220 and phase_B 225 binary signals by the quadrature decoder/timer block 235. Thus, in one embodiment of the present invention, these operations are synchronised, for example in the hardware circuit 600 within the digital signal controller or microcontroller, as illustrated in FIG. 6.

In FIG. 6 timer C0 605 is arranged to work in a quadrature decoder mode and generate two output signals 610, 615. The first output signal 610 toggles state at each edge of the phase_A 220 and phase_B 225 signals. The second output signal 615 is tied to either log.1 or log.0, if signal phase_A 220 is 90 degrees advanced or delayed of signal phase_B 225, respectively. The timer C1 620 inputs are connected to the timer C0 605 outputs.

The timer C1 620 is arranged to work in a signed counting mode, respectively counting 'up' or counting 'down' edges fed by line 610 dependent upon whether sign line 615 is positive or negative. The timer C2 630 is fed by a clock signal and generates periodical synchronization events 625, which are propagated further to analogue-to-digital converter 230 and to timer C1 620.

When a synchronization event 625 occurs, the timer C1 620 latches its counter value in the appropriate latch register and analogue-to-digital converter 230 initiates conversion of the sine 210 and cosine 215 analogue signals.

In this manner, such a circuit effectively triggers measurements of the analogue quantities (sine 210 and cosine 215) together with concurrent decoding phase_A 220 and phase_B 225 quadrature signals.

It will be understood that the improved Sin-Cos sensor arrangement, and method of operation therefor, as described above, aims to provide at least one or more of the following advantages:
  (i) A low-cost, efficient mechanism to implement a high precision Sin-Cos sensor interface;
  (ii) The inventive concept lends itself to high volume applications, due to the low processor requirements in performing the required calculations;
  (iii) Low cost of external hardware required to support embodiments of the present invention, for example Schmitt triggers may be used instead of expensive comparators or even no external components are required provided digital signal controller or microcontroller has 'Schmitt-triggered' general purpose input-output (GPIO) ports;
  (iv) The software driver according to some embodiments of the present invention provides a cost benefit for users/customers due to the need for smaller memory and lower calculation power;
  (v) The inventive concept can be applied as a fully software-based solution that provides a fast, efficient and high accuracy position and speed estimation based on the processing of the sine and cosine signals of the Sin-Cos sensors, through unique interconnection of the 'position composer' and 'angle tracking observer' logic functions.
  (vi) The angle tracking observer yields not only position estimates ($\theta_{est}$ 370), but also speed estimates ($\omega_{est}$ 365) as an outer product.
  (vii) In addition, the software driver is able to check a number of overflows of estimated position ($\theta_{est}$ 370), and thus accurately monitor a number of rotor revolutions.
  (viii) The dynamic response and noise reduction of estimated position ($\theta_{est}$ 370) and estimated speed ($\omega_{est}$ 365) is fully controlled by parameters $K_1$ and $K_2$ of the angle tracking observer.
  (ix) The angle extractor logic may be designed not only to perform calculation of four quadrant inverse tangent function, which is used in most of cases when Sin-Cos sensors generate pure sine and cosine waveforms, but it may materialize angle extraction from either non-sinusoidal signals or signals of various phase-shift. This fact, together with the possibility to compensate for phase shifts between analogue sine and cosine signals and their binary phase_A and phase_B counterparts, makes the software driver ideal for processing signals of generic Sin-Cos sensors equipped with low-cost hardware interfaces.

In particular, it is envisaged that the aforementioned inventive concept can be applied by a semiconductor manufacturer to any integrated circuit that uses Sin-Cos sensors, such as digital signal controllers (DSCs), microcontrollers or other embedded processors. Thus, it is envisaged that embodiments of the invention may be implemented in any microcontrollers or DSCs that support the required processing capability to perform the aforementioned calculation. For example, in some embodiments, it may be beneficial if the microcontroller or DSC supports peripherals, such as an analogue-to-digital converter, a timer and 'Schmitt triggered' input ports.

In particular, the inventive concept can be applied to a wide variety of automotive systems (using x-by-wire applications) that require high reliability; or alternatively an ability to operate in harsh environments and industrial positioning systems employing a high-accuracy servo. It is further envisaged that, for example, a semiconductor manufacturer may employ the inventive concept in a software-based design of a stand-alone Sin-Cos sensor and/or any other sub-system element.

It will be appreciated that any suitable distribution of functionality between different functional units or components or logic elements, may be used without detracting from the inventive concept herein described. Hence, references to specific functional devices or elements are only to be seen as references to suitable means for providing the described functionality, rather than indicative of a strict logical or physical structure or organization.

Aspects of the invention may be implemented in any suitable form including hardware, software, firmware or any combination of these. The elements and components of an embodiment of the invention may be physically, functionally and logically implemented in any suitable way. Indeed, the functionality may be implemented in a single unit or IC, in a plurality of units or ICs or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to "a", "an", "first", "second" etc. do not preclude a plurality.

Thus, an improved arrangement to extract data from Sin-Cos sensors and/or resolvers, and a method of operation therefor, have been described, wherein the aforementioned disadvantages with prior art arrangements and methods have been substantially alleviated.

The invention claimed is:

1. A Sin-Cos sensor arrangement comprising:
signal processing logic;
a Sin-Cos sensor operably coupled to the signal processing logic via a hardware interface, wherein the hardware interface is arranged to provide the signal processing logic with analogue sine and cosine waveforms indicative of fine position data and binary counterparts of the analogue sine and cosine waveforms (phase_A and phase_B) indicative of rough position data, wherein the signal processing logic is arranged to determine a position and speed of the Sin-Cos sensor by compensating for inaccuracies between the analogue sine and cosine waveforms and the binary counterparts.

2. The Sin-Cos sensor arrangement of claim 1 wherein the signal processing logic comprises a software driver to perform compensation for the inaccuracies between the analogue sine and cosine waveforms and the binary counterparts.

3. The Sin-Cos sensor arrangement of claim 1 wherein the signal processing logic comprises angle extractor logic arranged to provide the fine position data ($\theta_{low}$) based on one or more of the following:
analysis performed on the analogue sine and cosine waveforms, analysis of the analogue sine and cosine waveforms or non-linear waveforms, for example where the non-linear waveforms are approximated either by a set of differential functions and/or using a look-up table.

4. The Sin-Cos sensor arrangement of claim 1 wherein the analogue sine and cosine waveforms are generated by either the hardware interface or directly by the Sin-Cos sensor.

5. The Sin-Cos sensor arrangement of claim 1 wherein the signal processing logic comprises digital position extractor logic arranged to provide the rough position data ($\theta_{high}$) based on phase counting of the binary counterparts (phase_A and phase_B).

6. The Sin-Cos sensor arrangement of claim 5 wherein angle extractor logic and the digital position extractor logic are operably coupled to position composer logic arranged to combine the fine position data ($\theta_{low}$) with rough position data ($\theta_{high}$).

7. The Sin-Cos sensor arrangement of claim 6, wherein the position composer logic is operably coupled to angle tracking observer logic arranged to provide a smooth composed position ($\theta_{est}$).

8. The Sin-Cos sensor arrangement of claim 6 wherein the position composer logic is operably coupled to angle tracking observer logic arranged to provide speed estimates ($\omega_{est}$).

9. The Sin-Cos sensor arrangement of claim 6, wherein the angle tracking observer logic applies a transfer function to provide a smooth composed position ($\theta_{est}$):

$$F(s) = \frac{\hat{\Theta}(s)}{\Theta(s)} = \frac{K_1(1 + K_2 s)}{s^2 + K_1 K_2 s + K_1};$$

wherein $\hat{\Theta}(s)$ is a position at a first time, $\Theta(s)$ is a position at a second time, $K_1$ is a first parameter of the angle tracking observer, $K_2$ is a second parameter of the angle tracking observer, and s is a time variable.

10. The Sin-Cos sensor arrangement of claim 2, wherein the software driver is operably coupled to a digital signal controller or microcontroller arranged to utilise Sin-Cos output signals.

11. An integrated circuit for operable coupling to a Sin-Cos sensor, comprising:
signal processing logic operably coupled to a hardware interface, wherein the hardware interface is arranged to provide the signal processing logic with analogue sine and cosine waveforms indicative of fine position data and binary counterparts of the analogue sine and cosine waveforms (phase_A and phase_B) indicative of rough position data, wherein the signal processing logic is arranged to determine a position and speed of the Sin-Cos sensor by compensating for inaccuracies between the analogue sine and cosine waveforms and the binary counterparts.

12. The integrated circuit of claim 11 wherein the signal processing logic comprises a software driver to perform compensation for the inaccuracies between the analogue sine and cosine waveforms and the binary counterparts.

13. The integrated circuit of claim 11 wherein the signal processing logic comprises angle extractor logic arranged to provide the fine position data ($\theta_{low}$) based on one or more of the following:
analysis performed on the analogue sine and cosine waveforms, analysis of the analogue sine and cosine waveforms or non-linear waveforms, for example where the non-linear waveforms are approximated either by a set of differential functions and/or using a look-up table.

14. The integrated circuit of claim 11 wherein the analogue sine and cosine waveforms are generated by either the hardware interface or directly by the Sin-Cos sensor.

15. The integrated circuit of claim 11, wherein the signal processing logic comprises digital position extractor logic arranged to provide the rough position data ($\theta_{high}$) based on phase counting of the binary counterparts (Phase_A and Phase_B).

16. The integrated circuit of claim 15 wherein angle extractor logic and the digital position extractor logic are operably coupled to position composer logic arranged to combine the fine position data ($\theta_{low}$) with the rough position data ($\theta_{high}$).

17. The integrated circuit of claim 16, wherein the position composer logic is operably coupled to angle tracking observer logic arranged to provide a smooth composed position ($\theta_{est}$).

18. The integrated circuit of claim 16 wherein the position composer logic is operably coupled to angle tracking observer logic arranged to provide speed estimates ($\omega_{est}$).

19. The integrated circuit of claim 12 the software driver is operably coupled to a digital signal controller or microcontroller arranged to utilise Sin-Cos output signals.

20. A method for determining a position and speed of a Sin-Cos sensor comprising:
sampling, by a hardware interface, analogue sine and analogue cosine signals indicative of fine position data ($\theta_{low}$);

performing phase decoding of the sampled analogue sine and analogue cosine signals to generate binary counterpart signals indicative of rough position data ($\theta_{high}$); and combining, by a signal processing logic, the rough position data ($\theta_{high}$) with the fine position data ($\theta_{low}$) to compensate for inaccuracies between the analogue sine and cosine waveforms and the binary counterpart signals thereby determining the position and speed of the Sin-Cos sensor.

21. The method for determining the position and speed of the Sin-Cos sensor of claim 20 wherein the step of combining comprises placing the rough position data in higher bits; and adding the higher bits to the fine position data.

* * * * *